(12) United States Patent
Zhang et al.

(10) Patent No.: US 8,339,754 B2
(45) Date of Patent: Dec. 25, 2012

(54) TMR OR CPP STRUCTURE WITH IMPROVED EXCHANGE PROPERTIES

(75) Inventors: Kunliang Zhang, Milpitas, CA (US); Hui-Chuan Wang, Pleasanton, CA (US); Tong Zhao, Fremont, CA (US); Min Li, Dublin, CA (US)

(73) Assignee: Headway Technologies, Inc., Milpitas, CA (US)

(*) Notice: Subject to any disclaimer, the term of this patent is extended or adjusted under 35 U.S.C. 154(b) by 0 days.

(21) Appl. No.: 13/135,277

(22) Filed: Jun. 30, 2011

(65) Prior Publication Data

US 2011/0268992 A1 Nov. 3, 2011

Related U.S. Application Data

(62) Division of application No. 11/820,251, filed on Jun. 19, 2007, now Pat. No. 7,978,439.

(51) Int. Cl.
*G11B 5/39* (2006.01)

(52) U.S. Cl. .................................. 360/324.2

(58) Field of Classification Search ........... 360/324.11, 360/324.12, 324.2; 428/810–816; 257/421–427; 365/145, 158, 171–172
See application file for complete search history.

(56) References Cited

U.S. PATENT DOCUMENTS

| | | | |
|---|---|---|---|
| 6,718,621 B1 | 4/2004 | Hayashi et al. | |
| 6,801,414 B2 | 10/2004 | Amano et al. | |
| 6,904,669 B2 | 6/2005 | Sato et al. | |
| 7,063,904 B2 | 6/2006 | Ikarashi et al. | |
| 7,379,280 B2 | 5/2008 | Fukumoto et al. | |
| 7,476,954 B2 | 1/2009 | Wang et al. | |
| 7,564,658 B2 | 7/2009 | Zhang et al. | |
| 7,602,033 B2 | 10/2009 | Zhao et al. | |
| 7,646,568 B2 | 1/2010 | Zhang et al. | |
| 2005/0219769 A1* | 10/2005 | Shimura et al. | 360/324.2 |

* cited by examiner

*Primary Examiner* — Angel A. Castro
(74) *Attorney, Agent, or Firm* — Saile Ackerman LLC; Stephen B. Ackerman

(57) ABSTRACT

An insertion layer is provided between an AFM layer and an AP2 pinned layer in a GMR or TMR element to improve exchange coupling properties by increasing Hex and the Hex/Hc ratio without degrading the MR ratio. The insertion layer may be a 1 to 15 Angstrom thick amorphous magnetic layer comprised of at least one element of Co, Fe, or Ni, and at least one element having an amorphous character selected from B, Zr, Hf, Nb, Ta, Si, or P, or a 1 to 5 Angstrom thick non-magnetic layer comprised of Cu, Ru, Mn, Hf, or Cr. Preferably, the content of the one or more amorphous elements in the amorphous magnetic layer is less than 40 atomic %. Optionally, the insertion layer may be formed within the AP2 pinned layer. Examples of an insertion layer are CoFeB, CoFeZr, CoFeNb, CoFeHf, CoFeNiZr, CoFeNiHf, and CoFeNiNbZr.

11 Claims, 4 Drawing Sheets

TMR OR CPP STRUCTURE WITH IMPROVED EXCHANGE PROPERTIES

This is a Divisional application of U.S. patent application Ser. No. 11/820,251, filed on Jun. 19, 2007 now U.S. Pat. No. 7,978,439, which is herein incorporated by reference in its entirety, and assigned to a common assignee.

RELATED PATENT APPLICATIONS

This application is related to the following: Ser. No. 11/811,930, filing date May 29, 2007; Ser. No. 11/317,598, filing date Dec. 23, 2005; Ser. No. 11/652,740, filing date Jan. 12, 2007; all assigned to a common assignee and all of which are herein incorporated by reference in their entirety.

FIELD OF THE INVENTION

The invention relates to a high performance Magnetic Tunneling Junction (MTJ) element and a method for making the same, and in particular, to an amorphous insertion layer formed between the AFM and pinned layers, or within the AP2 layer in the pinned layer stack that improves the Hex/Hc ratio and results in less pin dispersion than with a conventional MTJ element.

BACKGROUND OF THE INVENTION

A CPP-GMR head is considered as one promising sensor to replace the conventional CIP (current in plane) GMR head for over 200 Gb/in$^2$ recording density. In a typical CPP-GMR sensor, a bottom synthetic spin valve film stack is employed for biasing reasons and a CoFe/NiFe composite free layer is conventionally used following the tradition of CIP-GMR technology. GMR spin valve stacks are known to have a configuration in which two ferromagnetic layers are separated by a non-magnetic conductive layer (spacer). One type of CPP-GMR sensor is called a metallic CPP-GMR that can be represented by the following configuration in which the spacer is a copper layer: Seed/AFM/AP2/Ru/AP1/Cu/free layer/capping layer. One of the ferromagnetic layers is a pinned layer in which the magnetization direction is fixed by exchange coupling with an adjacent anti-ferromagnetic (AFM) or pinning layer. The pinned layer may have a synthetic anti-parallel (SyAP) structure wherein an outer AP2 layer is separated from an inner AP1 layer by a coupling layer such as Ru. The second ferromagnetic layer is a free layer in which the magnetization vector can rotate in response to external magnetic fields. The rotation of magnetization in the free layer relative to the fixed layer magnetization generates a resistance change that is detected as a voltage change when a sense current is passed through the structure. In a CPP configuration, a sense current is passed through the sensor in a direction perpendicular to the layers in the stack. Alternatively, in the CIP sensor, the sense current passes through the sensor in a direction parallel to the planes of the layers in the sensor stack.

Ultra-high density (over 100 Gb/in$^2$) recording requires a highly sensitive read head. To meet this requirement, the CPP configuration is a stronger candidate than the CIP configuration which has been used in recent hard disk drives (HDDs). The CPP configuration is more desirable for ultra-high density applications because a stronger output signal is achieved as the sensor size decreases, and the magnetoresistive (MR) ratio is higher for a CPP configuration. An important characteristic of a GMR head is the MR ratio which is dR/R where dR is the change in resistance of the spin valve sensor and R is the resistance of the spin valve sensor before the change. A higher MR ratio is desired for improved sensitivity in the device and this result is achieved when electrons in the sense current spend more time within the magnetically active layers of the sensor. Interfacial scattering which is the specular reflection of electrons at the interfaces between layers in the sensor stack can improve the MR ratio and increase sensitivity.

Another type of sensor is a so-called confining current path (CCP) CPP GMR sensor where the current through the Cu spacer is limited by the means of segregating metal path and oxide formation. With a current confining (CCP) scheme, CPP GMR performance can be further improved. An example of a CCP CPP-GMR sensor has the following configuration: Seed/AFM/AP2/Ru/AP1/Cu/CCP layer/Cu/free layer/capping layer where the CCP layer is sandwiched between two copper layers.

In a CPP operation mode, a tunnel magnetoresistive (TMR) head is another candidate for realizing high sensitivity. In this design, the non-magnetic conductive layer between the pinned layer and free layer in the GMR stack is replaced by an insulating layer such as AlO$_X$ or MgO. When the magnetoresistive element is a magnetic tunnel junction (MTJ), the tunneling (insulating) layer may be thinned to give a very low RA (<5 ohms-μm$^2$).

A MTJ element in a magnetic device such as a read head may be based on a tunneling magneto-resistance (TMR) effect wherein a stack of layers has a configuration in which two ferromagnetic layers are separated by a thin non-magnetic dielectric layer. The bottom layer in the MTJ element is typically comprised of a seed layer such as NiFeCr or a Ta/NiCr composite which promotes a <111> lattice orientation in overlying layers. However, in a related Headway patent application HT06-031 which is herein incorporated by reference in its entirety, a Ta/Ru or Ta/Hf/NiFe seed layer may be employed to improve the Hex/Hc ratio. Generally, an antiferromagnetic (AFM) layer, ferromagnetic "pinned" layer, tunnel barrier layer, ferromagnetic "free layer", and a capping layer are successively formed on the seed layer to complete the MTJ stack. The pinned layer has a magnetic moment that is fixed in the "x" direction, for example, by exchange coupling with the adjacent AFM layer that is also magnetized in the "x" direction. The thin tunnel barrier layer above the pinned layer is so thin that a current through it can be established by quantum mechanical tunneling of conduction electrons.

The free layer has a magnetic moment that is either parallel or anti-parallel to the magnetic moment in the pinned layer. The magnetic moment of the free layer may change in response to external magnetic fields and it is the relative orientation of the magnetic moments between the free and pinned layers that determines the tunneling current and therefore the resistance of the tunneling junction. When a sense current is passed through the MTJ stack in a direction perpendicular to the layers therein, a lower resistance is detected when the magnetization directions of the free and pinned layers are in a parallel state ("1" memory state) and a higher resistance is noted when they are in an anti-parallel state or "0" memory state.

One indication of good device performance is a high magnetoresistive (TMR) ratio which is dR/R where R is the minimum resistance of the MTJ element and dR is the maximum change in resistance observed by changing the magnetic state of the free layer. In order to achieve desirable properties such as a specific junction resistance x area (RA) value, a high dR/R value, and a high breakdown voltage (Vb), it is necessary to have a smooth tunnel barrier layer that is promoted by a smooth and densely packed growth, such as a <111> texture for the AFM layer, pinned layer, and seed layer. Although a high RA value of about 10000 ohm-$\mu m^2$ is acceptable for a large area (A), RA should be relatively small (<1000 ohm-$\mu m^2$) for smaller areas. Otherwise, R would be too high to match the resistivity of the transistor which is connected to the MTJ. Other desirable magnetic properties for an MTJ are a small interlayer coupling field (Hin) between the pinned layer and free layer, and a strong exchange coupling field (Hex) between the AFM layer and pinned layer is important to maintain the pinned layer magnetization in a certain direction.

For better head performance, it is always desirable to have a larger Hex to ensure pinning robustness between the AFM and AP2 layers and a smaller pinning dispersion. In other words, a larger Hex/Hc ratio is needed to suppress pinning field related noise. Improvement in the exchange bias properties can be achieved by proper selection of the seed layer, AFM layer, and pinned layer. However, further optimization than heretofore achieved is necessary for ultra-high density recording heads.

During a routine search of the prior art, the following references were found. In U.S. Patent Application 2006/0061915, a 5 Angstrom thick CoFe layer is inserted between the seed layer and the AFM layer in a MTJ stack to increase Hex and the Hex/Hc ratio.

U.S. Patent Application 2006/0056114 describes the use of an oxide layer insertion into the pinned layer and adjacent to the AFM layer to prevent Mn diffusion from the AFM layer into the tunnel barrier layer. The composite magnetic layer may have an amorphous phase and a crystalline phase.

In U.S. Pat. No. 6,801,414, an amorphous layer is inserted into a pinned layer to suppress Mn diffusion from the AFM layer. The amorphous layer has a composition MX where X is an oxide, nitride, or carbide, and M may be Ti, Ta, V, Al, Sc, or Eu.

U.S. Pat. No. 6,718,621 discloses a pinned layer that may be comprised of an amorphous material such as CoFeB.

U.S. Pat. No. 7,063,904 describes a MTJ having a pinned layer and an AFM layer containing Cr so that the exchange coupling field (Hex) between the two layers is effectively increased. Preferably, the Cr concentration decreases with distance away from the interface between the two layers.

SUMMARY OF THE INVENTION

One objective of the present invention is to increase Hex between the AFM layer and AP2 pinned layer in a MTJ element in order to maintain the AP2 layer magnetization in a certain direction.

A further objective of the present invention is to reduce Hc for the AP2 layer in a MTJ element and thereby increase the Hex/Hc ratio and reduce pinning dispersions.

These objectives are achieved according to the present invention by first providing a substrate on which a MTJ element is to be formed. In one embodiment, the substrate is a bottom shield in a TMR read head and a MTJ stack of layers having a bottom spin valve configuration is formed on the substrate by sequentially depositing a seed layer, AFM layer, insertion layer, synthetic anti-parallel (SyAP) pinned layer, tunnel barrier layer, free layer, and a cap layer in a sputter deposition system. A key feature is that the insertion layer is an amorphous magnetic layer having a thickness between 1 and 15 Angstroms and comprised of at least one element from Co, Fe, or Ni and at least one element selected from B, Zr, Hf, Nb, Ta, Ti, Si, and P. Thus, the amorphous magnetic layer may have a composition including but not limited to CoFeB, CoFeZr, CoFeNiZr, CoFeHf, CoFeNiHf, CoFeNbZr, and CoFeNiNbZr, for example. Preferably the element selected from B, Zr, Hf, Nb, Ta, Ti, Si, and P has a content of less than 40 atomic % in the amorphous magnetic layer. Optionally, the insertion layer may be a non-magnetic layer with a thickness of less than 5 Angstroms and comprised of Cu, Ru, Mn, Hf, Cr, or the like.

In a second embodiment, the MTJ element has a GMR-CPP configuration in which a seed layer, AFM layer, insertion layer, pinned layer, spacer layer, free layer, and capping layer are sequentially formed on a substrate. The insertion layer between the AFM layer and AP2 pinned layer may be an amorphous magnetic layer or non-magnetic layer as described previously.

The present invention also encompasses a third embodiment which is similar to the first (TMR) embodiment except that the insertion layer (IL) is placed within the AP2 portion of the SyAP pinned layer. In the exemplary embodiment in which the SyAP pinned layer has an AP2/coupling layer/AP1 configuration where the AP2 layer is made of CoFe and the coupling layer is Ru, the resulting MTJ stack formed on the substrate is represented from bottom to top by the following: seed layer; AFM layer, CoFe/IL/CoFe/Ru/AP1; tunnel barrier layer; free layer; and capping layer. The insertion layer may be an amorphous magnetic layer or non-magnetic layer as described previously.

There is a fourth embodiment similar to the second (GMR-CPP) embodiment except that the insertion layer (IL) is placed within the AP2 portion of the SyAP pinned layer. In this case, the resulting MTJ stack formed on the substrate may be represented from bottom to top by the following: seed layer; AFM layer, CoFe/IL/CoFe/Ru/AP1; spacer layer; free layer; and capping layer. The insertion layer may be an amorphous magnetic layer or non-magnetic layer as described previously.

Furthermore, the present invention anticipates an embodiment in which a first insertion layer may be formed between an AFM layer and an AP2 pinned layer, and a second insertion layer as described herein may be formed within the AP2 pinned layer, either in a TMR element or in a GMR-CPP element.

The present invention also encompasses a method of forming the MTJ element comprised of the aforementioned insertion layer. All layers in the MTJ element are preferably formed in a sputter deposition system that includes one or more sputter deposition chambers and at least one oxidation chamber. In the TMR embodiments, an AlOx, MgO, AlTiOx, or TiOx layer may be employed as the tunnel barrier layer. In one aspect, the metal in the tunnel barrier layer is deposited in a sputter deposition chamber and then oxidized in an oxidation chamber by a natural oxidation (NOX) or radical oxidation (ROX) method. In the GMR-CPP embodiments, the spacer layer may be comprised of Cu or may have a confining current path (CCP) structure where the current path through the Cu spacer is limited by means of segregated metal path and oxide formation. After all layers in the MTJ element are laid down on the substrate, a conventional patterning and etching sequence may then be followed to define the shape of the MTJ element. Subsequently, an insulation layer may be deposited on either side of the MTJ and a top shield is formed on the insulation layer and top surface of the MTJ element in the TMR embodiments. A dielectric layer and a hard bias layer may be formed adjacent to the sidewalls of the MTJ element according to the GMR-CPP embodiments.

DETAILED DESCRIPTION OF THE INVENTION

The present invention is an insertion layer made of an amorphous magnetic material or a non-magnetic material that is formed between an AFM layer and an AP2 pinned layer in a MTJ stack to increase Hex and/or lower Hc and thereby increase the Hex/Hc ratio and reduce pinning dispersions. The drawings are provided by way of example and are not intended to limit the scope of the invention. Although the drawings depict a bottom spin valve structure, the present invention also applies to a top spin valve structure or a dual spin valve configuration in an MTJ element as appreciated by those skilled in the art. Moreover, the present invention is not limited to TMR or GMR-CPP configurations described in the exemplary embodiments but may be employed in MTJ elements for other applications such as MRAM devices. The present invention is also a method of making a MTJ element comprised of an insertion layer as described herein.

It is well known that the exchange bias properties in a MTJ element comprised of a seed layer/AFM layer/AP2 pinned layer configuration are determined by the surface net moment of the AFM interfacial layer adjacent to the AP2 layer which is typically CoFe. Optimizing the seed layer, AFM layer growth, and interface properties will improve the exchange properties of the AFM and AP2 layers. In a previous Headway patent application HT05-041 which is herein incorporated by reference in its entirety, the inventors demonstrated a dramatic improvement in exchange properties by employing a Ta/Ru seed layer for an IrMn AFM layer instead of a conventional Ta/NiCr seed layer. However, further improvement in Hex and Hex/Hc is possible by optimizing the interface of the AFM and AP2 pinned layers.

According to the present invention, it is believed that inserting an amorphous layer with a superfine grain or microcrystalline structure between the AFM and AP2 pinned layers will alter the interfacial net spin distributions in the AFM layer, especially after a thermal (annealing) treatment. As a result, more surface net spins will contribute to the exchange bias and less net spins will contribute to coercivity enhancement of the AP2 pinned layer, thereby increasing Hex and reducing Hc. Several embodiments that represent the successful manifestation of this concept will now be described.

Hereafter, the layer that promotes exchange coupling between an AFM layer and AP2 pinned layer will be referred to as an insertion layer. The insertion layer may also be defined as an exchange coupling film.

Figure 1:
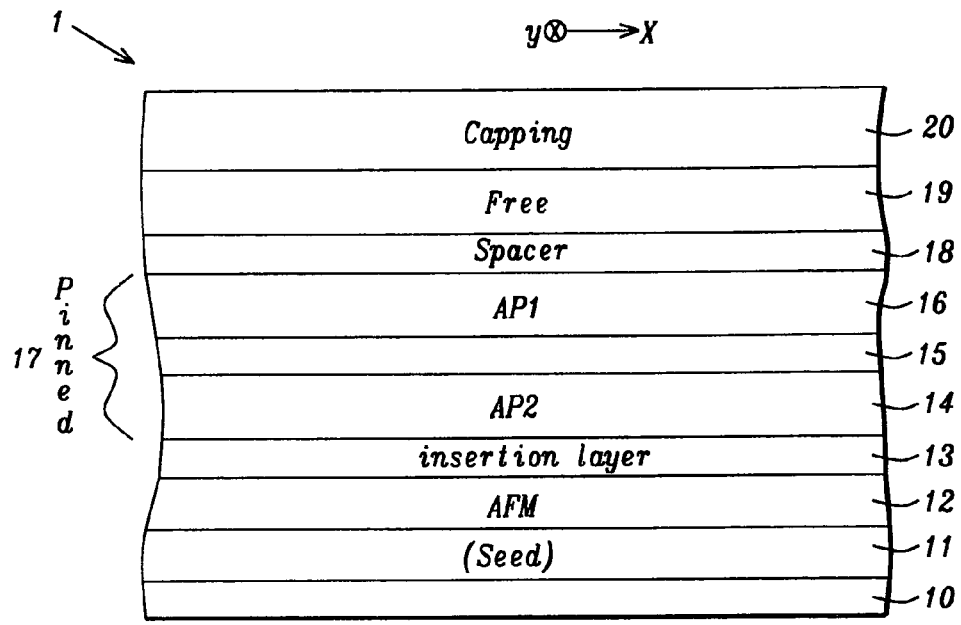
FIG. 1 is a cross-sectional view of a GMR-CPP sensor with a MTJ stack of layers having an insertion layer formed between an AFM layer and an AP2 pinned layer according to one embodiment of the present invention.

Referring to FIG. 1, a first embodiment is shown that relates to a metallic CPP-GMR sensor having a bottom spin valve structure. The view in FIG. 1 is from a cross-section along an air bearing surface (ABS) plane in the read head. A CPP-GMR sensor 1 will be described first and then a method of forming the stack of layers in the spin valve structure will be provided in a later section. A substrate 10 is shown that is typically a first magnetic shield (S1) in a read head. For example, the substrate 10 may be comprised of a 2 micron thick layer of an electroplated permalloy. There is a seed layer 11 that may be comprised of a lower Ta layer and an upper Ru layer (not shown) formed on the substrate 10. The seed layer 11 promotes a smooth and uniform crystal structure in the overlying layers that enhances the MR ratio in the CPP-GMR sensor 1.

An AFM layer 12 is formed on the seed layer 11 and is preferably comprised of IrMn having a composition of about 18 to 22 atomic % Ir and a thickness of about 50 to 75 Angstroms. Alternatively, the AFM layer 12 may be made of MnPt having a composition between about 55 to 65 atomic % manganese and with a thickness of about 125 to 175 Angstroms. Those skilled in the art will appreciate that other materials such as NiMn, OsMn, RuMn, RhMn, PdMn, RuRhMn, or PtPdMn may also be employed as the AFM layer 12 which is used to pin the magnetization direction in an overlying ferromagnetic (pinned) layer 17.

A key feature of the first embodiment of the present invention is an insertion layer 13 having a thickness of between 1 and 15 Angstroms and formed on the AFM layer 12. In one aspect, the insertion layer 13 may be made of an amorphous magnetic material comprised of at least one element selected from Fe, Co, or Ni and at least one element selected from B, Zr, Hf, Nb, Ta, Ti, Si, and P. Thus, the insertion layer 13 may have a ternary composition such as CoFeB, CoFeTa, CoFeZr, or CoFeHf, or a quaternary composition such as CoFeNiZr, CoFeNiHf, CoFeNiNb, CoFeHfZr, or CoFeNbZr, for example. The insertion layer 13 may also be comprised of five elements as in CoFeNiNbZr, CoFeNiHfZr, and CoFeNiHfNb, for example. Preferably, the at least one element selected from B, Zr, Hf, Nb, Ta, Ti, Si, and P has a content less than 40 atomic % in the resulting alloy. In the examples where the insertion layer 13 has two elements selected from B, Zr, Hf, Nb, Ta, Ti, Si, and P, the combination of the two elements is preferably less than 40 atomic % in the alloy. When the content of the at least one element selected from B, Zr, Hf, Nb, Ta, Ti, Si, and P exceeds 40 atomic %, the insertion layer 13 may become non-magnetic and lose some of its effectiveness in modifying the spin states of the adjacent AFM layer 12.

Optionally, the insertion layer 13 may be comprised of a non-magnetic material such as Cu, Ru, Mn, Hf, Nb, Zr, Cr, or the like that has a thickness from about 1 to 5 Angstroms. In this case, the non-magnetic layer is not necessarily amorphous and may operate by a different mechanism than described previously to affect the spin states of the adjacent AFM layer 12. Although not bound by theory, the inventors believe that a non-magnetic layer affects the AFM layer spin states by reducing the exchange strength between AFM grains and neighboring FM grains so that more of the AFM grains will contribute to exchange bias rather than coercivity enhancement, resulting in Hex enhancement and Hc reduction. There is a factor "r" to define the grains contributing to Hex or Hc where $r = J_{AFM\text{-}FM}/2K_{AFM}t_{AFM}$ in which $J_{AFM\text{-}FM}$ is the exchange coupling strength between AFM grains and FM grains, $K_{AFM}$ is the exchange anisotropy of AFM grains, and $t_{AFM}$ is the thickness of AFM grains. When r>0.5, all grains will contribute to Hc and when r<0.5, all grains will contribute to Hex. Thus, modifying the r value through $J_{AFM\text{-}FM}$ or $K_{AFM}t_{AFM}$ will change the distributions for Hex or Hc.

There is a synthetic anti-parallel (SyAP) pinned layer 17 formed on the insertion layer 13 that has an AP2/coupling layer/AP1 configuration. The AP2 layer 14 in the pinned layer is preferably comprised of CoFe with a composition of about 75 to 90 atomic % cobalt and a thickness of about 20 to 50 Angstroms and is formed on the insertion layer 13. The magnetic moment of the AP2 layer 14 is pinned in a direction anti-parallel to the magnetic moment of the AP1 layer 16. For example, the AP2 layer may have a magnetic moment oriented along the "+x" direction while the AP1 layer has a magnetic moment in the "−x" direction. The AP2 layer 13 may be slightly thicker than the AP1 layer to produce a small net magnetic moment for the pinned layer 17. Exchange coupling between the AP2 layer 14 and the AP1 layer 16 is facilitated by a coupling layer 15 that is preferably comprised of Ru with a thickness of about 7.5 Angstroms. Optionally, Rh or Ir may be employed as the coupling layer 15.

A non-magnetic spacer 18 is formed on the SyAP pinned layer 17 and may be made of Cu with a thickness of about 20 to 50 Angstroms. In an alternative embodiment, the non-magnetic spacer 18 may have a CCP configuration in which the current path through a copper spacer is limited by means of segregating metal path and oxide formation. One CCP configuration that is well known in the industry is represented by Cu/CCP/Cu where a CCP layer made of an alumina template and segregated copper paths therein is sandwiched between two thin Cu layers. In one aspect, the lower Cu layer is about 2 to 8 Angstroms thick and the upper Cu layer has a thickness between 2 and 6 Angstroms. The CCP layer has a thickness from about 6 to 10 Angstroms and may be derived from AlCu and a portion of the lower Cu layer that are subjected to a plasma ion treatment followed by an ion assisted oxidation process.

Above the non-magnetic spacer 18 is a free layer 19 that may be comprised of CoFe. Alternatively, the free layer 19 may be a composite in which a bottom layer made of CoFe is formed on the non-magnetic spacer 18 and a NiFe layer is disposed on the CoFe layer. The present invention also anticipates that other soft magnetic materials may be employed as the free layer 19 in the GMR-CPP sensor 1.

At the top of the GMR-CPP sensor stack is a capping layer 20 that may be a composite comprised of a lower Ru layer on the free layer 19 and a Ta layer on the Ru layer. Optionally, the capping layer 20 may be comprised of a composite such as Ru/Ta/Ru or other suitable capping layer materials used by those skilled in the art.

Figure 2:
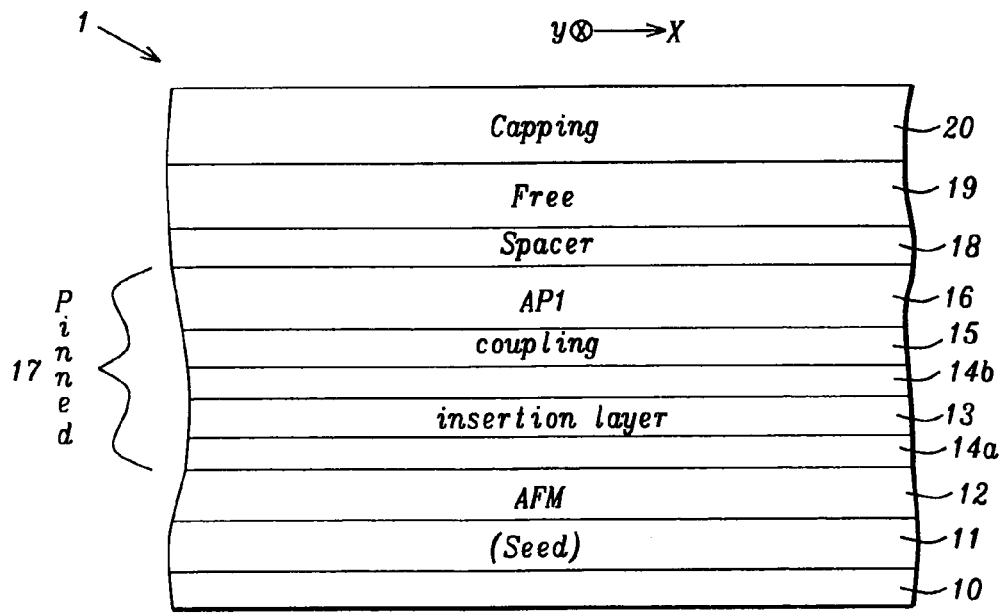
FIG. 2 is a cross-sectional view of a GMR-CPP sensor with a MTJ stack of layers in which an insertion layer is formed within an AP2 pinned layer according to a second embodiment of the present invention.

Referring to FIG. 2, a second embodiment is depicted that has the same MTJ stack of layers as in FIG. 1 except the insertion layer 13 has been moved into the AP2 pinned layer to give a CoFe/insertion layer/CoFe configuration. As a result, there is a lower portion 14a of the CoFe AP2 layer with a thickness of about 1 to 10 Angstroms adjacent to the AFM layer 12 and an upper portion 14b of the CoFe AP2 layer having a thickness from 5 to 25 Angstroms formed adjacent to the coupling layer 15. Note that the insertion layer 13 formed between layers 14a, 14b still influences the surface net spins at the AFM layer 12 interface with the lower CoFe AP2 layer 14a because it is believed that during a subsequent annealing process, at least a portion of the insertion layer migrates through the lower AP2 layer to the interface with AFM layer.

Figure 7:
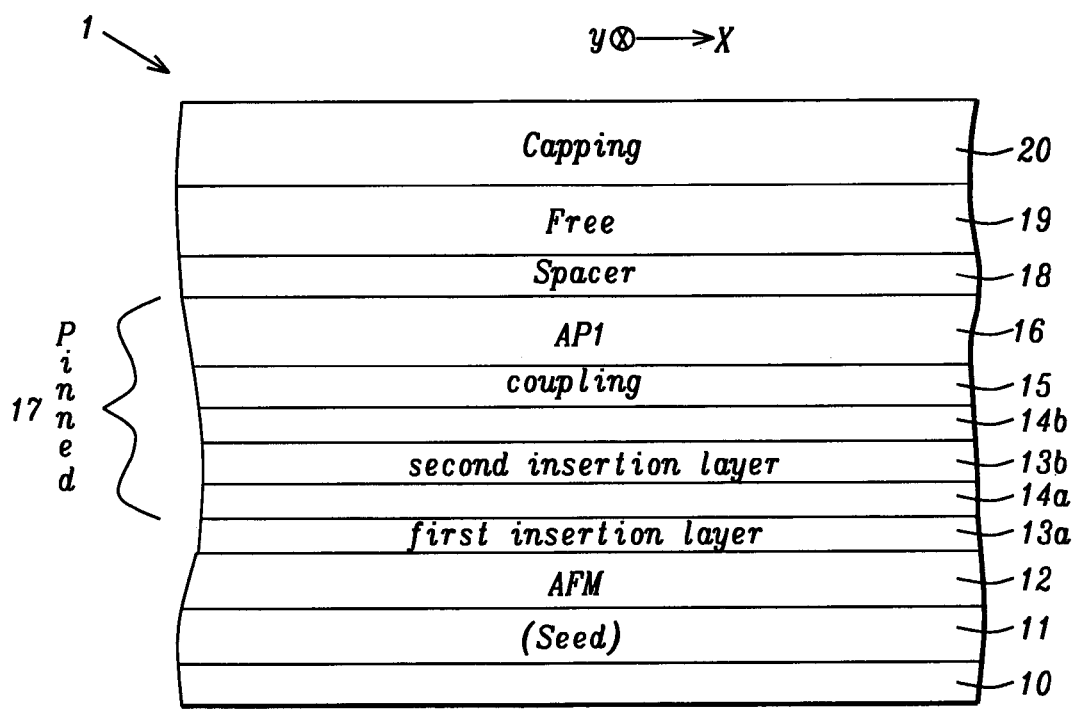
FIG. 7 is a cross-sectional view of a GMR-CPP sensor with a first insertion layer formed between an AFM layer and an AP2 pinned layer, and a second insertion layer formed within the AP2 pinned layer according to an embodiment of the present invention.

Referring to FIG. 7, another embodiment is illustrated wherein a first insertion layer 13a is formed between the AFM layer 12 and AP2 layer 14 as in the first embodiment and a second insertion layer 13b is formed within the AP2 layer as described in the second embodiment. The second insertion layer 13b is formed between a lower portion 14a and an upper portion 14b of the AP2 layer.

The present invention also encompasses an annealing step after all of the MTJ layers have been deposited. For example, in the GMR-CPP embodiments, the MTJ stack comprised of seed layer 11, AFM layer 12, one or more insertion layers 13, pinned layer 17, spacer 18, free layer 19, and capping layer 20 may be annealed by applying a magnetic field of about 10K Oe in magnitude along a certain axis for about 0.5 to 20 hours at a temperature between 250° C. and 350° C.

Figure 3:
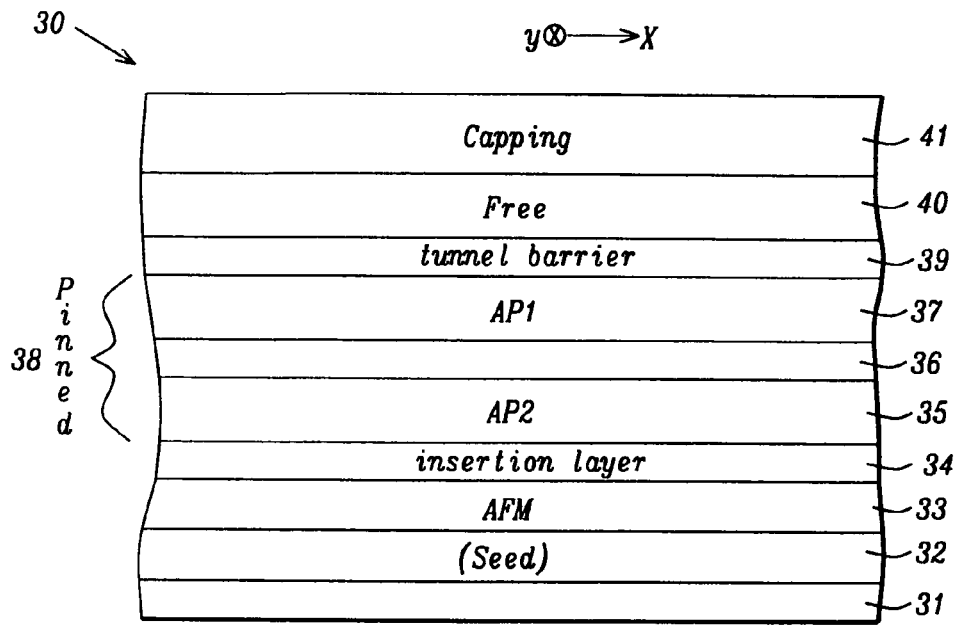
FIG. 3 is a cross-sectional view of a TMR sensor with a MTJ stack of layers having an insertion layer formed between an AFM layer and an AP2 pinned layer according to a third embodiment of the present invention.

Referring to FIG. 3, a third embodiment of the present invention is depicted that relates to a TMR head 30 in which a MTJ stack of layers is formed on a substrate 31 that may be a bottom shield (S1). The substrate may be a composite comprised of a lower NiFe layer and an upper α-TaN capping layer, for example. Typically, the substrate 31 is fabricated on a sub-structure (not shown) that is AlTiC or the like.

In one embodiment, the MTJ stack of layers is disposed on the substrate 31 by sequentially forming a seed layer 32, AFM layer 33, insertion layer 34, SyAP pinned layer 38, tunnel barrier layer 39, free layer 40, and a capping layer 41. In the exemplary embodiment, the seed layer 32 and AFM layer 33 have the same composition as described previously for seed layer 11 and AFM layer 12, respectively. It should be understood that an external magnetic field may be applied during the deposition of a MTJ layer such as an AFM layer or a pinned layer to influence a magnetization along a certain axis. In the exemplary embodiment, the AFM layer 33 is magnetically aligned along the x-axis.

A key feature of the present invention is an insertion layer 34 having a thickness of between 1 and 15 Angstroms formed on the AFM layer 33. In one aspect, the insertion layer 34 may be made of an amorphous magnetic material comprised of at least one element selected from Fe, Co, or Ni and at least one element selected from B, Zr, Hf, Nb, Ta, Ti, Si, and P. Thus, the insertion layer 34 may have a ternary composition such as CoFeB, CoFeTa, CoFeZr, or CoFeHf, or a quaternary composition such as CoFeNiZr, CoFeNiHf, CoFeNiNb, CoFeHfZr, or CoFeNbZr, for example. The insertion layer 34 may also be comprised of five elements as in CoFeNiNbZr, CoFeNiHfZr, and CoFeNiHfNb, for example. Preferably, the at least one element selected from B, Zr, Hf, Nb, Ta, Ti, Si, and P has a content less than 40 atomic % in the resulting alloy. In the examples where the insertion layer 34 has two elements selected from B, Zr, Hf, Nb, Ta, Ti, Si, and P, the combination of the two elements is preferably less than 40 atomic % in the alloy. Optionally, the insertion layer 34 may be comprised of a non-magnetic material such as Cu, Ru, Mn, Hf, Nb, Zr, Cr, or the like that has a thickness from about 1 to 5 Angstroms.

The SyAP pinned layer 38 formed on the insertion layer 34 preferably has an AP2/coupling layer/AP1 configuration. The AP2 layer 35 is formed on the insertion layer 34 and may be comprised of CoFe with a thickness of about 10 to 50 Angstroms. Those skilled in the art will appreciate that other materials may be employed for the AP2 layer 35 including but not limited to a FCC like trilayer with a composition represented by $Co_ZFe_{(100-Z)}/Fe_{(100-X)}Ta_X/Co_ZFe_{(100-Z)}$ or $Co_ZFe_{(100-Z)}/Fe_YCo_{(100-Y)}/Co_ZFe_{(100-Z)}$ where x is 3 to 30 atomic %, y is 40 to 100 atomic %, and z is 75 to 100 atomic %. The magnetic moment of the AP2 layer (not shown) is pinned in a direction anti-parallel to the magnetic moment of AP1 layer 37. For example, the AP2 trilayer may have a magnetic moment oriented along the "+x" direction while the AP1 layer has a magnetic moment in the "−x"

direction. The slight difference in thickness between the AP2 layer 35 and AP1 layer 37 produces a small net magnetic moment for the SyAP pinned layer 38.

Exchange coupling between the AP2 layer 35 and the AP1 layer 37 is facilitated by a coupling layer 36 that is preferably comprised of Ru with a thickness of about 7.5 Angstroms although Rh or Ir may be used instead of Ru. In one embodiment, the AP1 layer 37 is comprised of CoFe with a composition of about 25 to 50 atomic % Fe and a thickness of 10 to 25 Angstroms. Optionally, the AP1 layer 37 may be a composite layer that includes a thin nano-oxide layer (NOL) such as FeTaO or CoFeO sandwiched between CoFe layers. The nano-oxide layer is employed to increase smoothness of the AP1 layer. In another embodiment, the AP1 layer 37 may be a laminated film comprised of CoFe and Cu layers with a $[CoFe/Cu]_n/CoFe$ configuration where n is 2 or 3. The present invention also anticipates an AP1 layer 37 that is a composite having a lower CoFeB layer and an upper CoFe layer.

Above the SyAP pinned layer 38 is formed a thin tunnel barrier layer 39 which is an oxidized metal layer such as AlOx, MgO, AlTiOx, or TiOx. In one embodiment, a 5 to 6 Angstrom thick Al layer is deposited on the SyAP pinned layer 38 and is subsequently oxidized by an in-situ radical oxidation (ROX) that involves a plasma oxidation process in which a grid-like cap is placed between an upper ionizing electrode and a substrate surface (Al layer) in an oxidation chamber of the sputter deposition tool that is used to deposit the Al layer. The resulting $AlO_X$ layer has a thickness of about 7 to 11 Angstroms and has excellent smoothness and uniformity because of the smooth and densely packed seed layer 32 and a <111> crystal structure in underlying AFM layer 33 and SyAP pinned layer 38. Alternatively, the tunnel barrier layer 39 may have a Mg/MgO/Mg configuration wherein a Mg layer (not shown) about 8 Angstroms thick is deposited on the SyAP pinned layer 38. Then a ROX or natural oxidation (NOX) process is performed to oxidize the Mg layer. Subsequently, a second Mg layer about 4 Angstroms thick is deposited on the oxidized Mg layer to result in a Mg/MgO/Mg tunnel barrier layer 39. The Mg/MgO/Mg configuration formed by the method described herein has been found to provide better RA uniformity than sputter depositing a MgO tunnel barrier layer.

The free layer 40 formed on the tunnel barrier layer 39 may be a composite CoFe/NiFe layer in which a CoFe layer with a thickness of about 5 to 15 Angstroms is formed on the tunnel barrier layer and a NiFe layer having a thickness between about 20 and 40 Angstroms is disposed on the CoFe layer. In one embodiment, the CoFe layer has the same composition as the one or more CoFe layers in the previously described AP1 layer 37. The present invention also encompasses an embodiment in which a nano-oxide layer is formed between the CoFe and NiFe layers in the free layer 18. Alternatively, when the AP1 layer 37 in the SyAP pinned layer 38 is made of CoFeB and the tunnel barrier layer 39 is comprised of MgO, then the free layer 40 may also be comprised of CoFeB. A moderate spin polarization material is preferably selected as the free layer to help minimize the magnetostriction ($\lambda_S$) in the MTJ element. In the example of the composite CoFe/NiFe free layer, a NiFe layer in which the Fe content is between about 8 atomic % and 21 atomic % may be advantageously employed to minimize magnetostriction. The free layer 40 is magnetically aligned along the x-axis (pinned layer direction). When the TMR sensor 30 (MTJ element) is elliptically shaped as seen in a top view (not shown), the easy axis of the MTJ element is along the long axis.

In one embodiment, there is a capping layer 41 comprised of Ru, Ta, or a composite thereof formed on the free layer 40.

Typically, the capping layer 41 has a thickness from about 60 to 250 Angstroms. Optionally, other capping layer materials may be used. When the capping layer 41 is a composite layer comprised of an upper or "outer" layer, the outer layer is preferably a material such as Ru that is resistant to oxidation, provides good electrical contact with a subsequently deposited top shield (not shown), and is a low resistance conductor. Moreover, an outer capping layer such as Ru may be selected to serve as an efficient stopping layer during a chemical mechanical polish (CMP) process that may be employed during a later stage of the TMR fabrication sequence.

Figure 4:
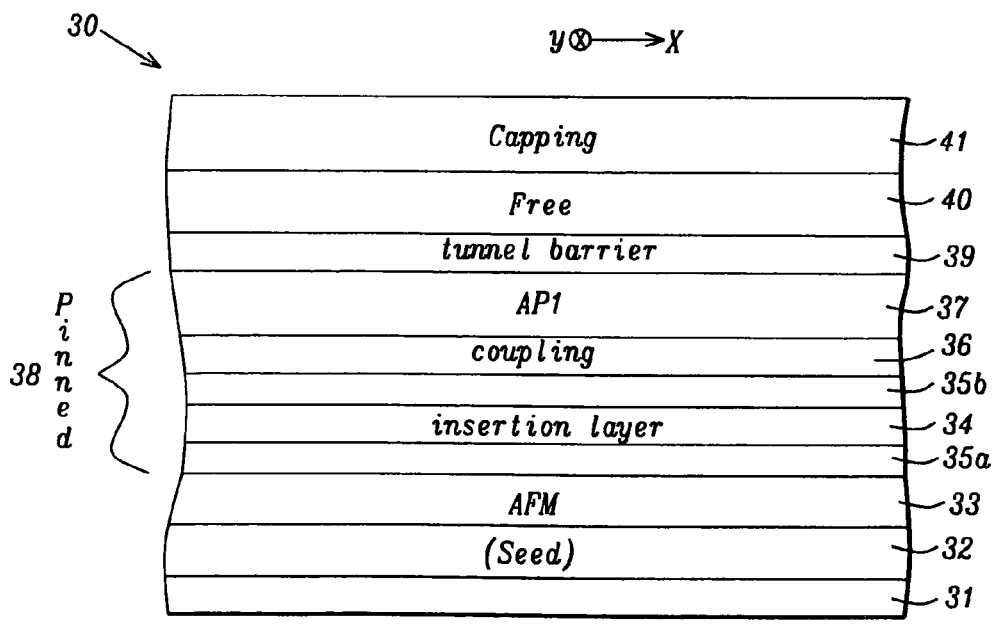
FIG. 4 is a cross-sectional view of a TMR sensor with a MTJ stack of layers in which an insertion layer is formed within an AP2 pinned layer according to a fourth embodiment of the present invention.

Referring to FIG. 4, there is a fourth embodiment that has the same MTJ stack of layers as in FIG. 3 except the insertion layer 34 has been moved into the AP2 pinned layer to give a CoFe/insertion layer/CoFe configuration. As a result, there is a lower portion 35a of the CoFe AP2 layer with a thickness of about 1 to 10 Angstroms adjacent to the AFM layer 33 and an upper portion 35b of the CoFe AP2 layer having a thickness from 5 to 25 Angstroms formed adjacent to the coupling layer 36.

Furthermore, another embodiment (not shown) is anticipated wherein a first insertion layer is formed between the AFM layer 33 and AP2 layer 35 as in the third embodiment and a second insertion layer is formed within the AP2 layer as described in the fourth embodiment.

All of the layers in TMR sensor 30 may be laid down in a sputter deposition system. For instance, the MTJ stack of layers may be formed in an Anelva C-7100 thin film sputtering system or the like which typically includes three physical vapor deposition (PVD) chambers each having 5 targets, an oxidation chamber, and a sputter etching chamber. At least one of the PVD chambers is capable of co-sputtering. Typically, the sputter deposition process involves an argon sputter gas and the targets are made of metal or alloys to be deposited on a substrate. All of the MTJ layers may be formed after a single pump down of the sputter system to enhance throughput. It should be understood that the insertion layer 34 which is comprised of a plurality of elements may be deposited by co-sputtering each of the individual elements, or by co-sputtering one or more alloys, or by co-sputtering one or more alloys with one or more individual elements.

The present invention also encompasses an annealing step after all of the MTJ layers have been deposited. In the TMR embodiments, the MTJ stack comprised of seed layer 32, AFM layer 33, one or more insertion layers 34, pinned layer 38, spacer 39, free layer 40, and capping layer 41 may be annealed by applying a magnetic field of about 10K Oe in magnitude along a certain axis for about 0.5 to 20 hours at a temperature between 250° C. and 350° C.

Figure 5:
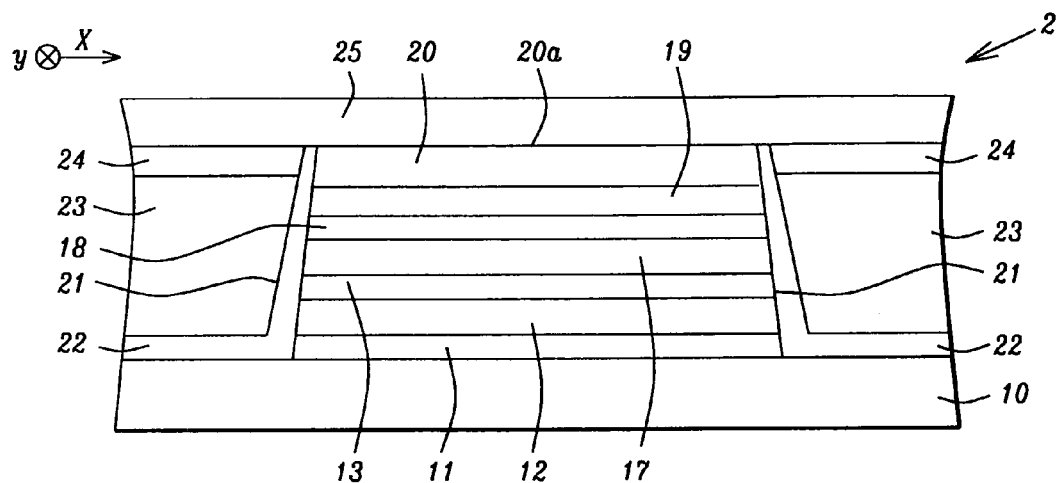
FIG. 5 is a cross-sectional view of a read head comprised of a GMR-CPP sensor according to the first embodiment.

Referring to FIG. 5, a GMR-CPP head 2 having a MTJ element comprised of layers 11-20 and with sidewalls 21 and a top surface 20a may be fabricated by coating and patterning a photoresist layer (not shown) on the capping layer surface 20a after all of the layers in the MTJ stack are deposited. The photoresist layer serves as an etch mask during an ion beam etch (IBE) or reactive ion etch (RIE) sequence that transfers the pattern through the MTJ stack of layers to form the sidewalls 21 that are typically sloped so that the top surface 20a has a smaller width along the x-axis than that of the seed layer 11. Once the etch sequence is complete, the photoresist layer may be removed by a conventional stripping process known to those skilled in the art.

Thereafter, a first dielectric layer 22 made of $Al_2O_3$ or the like with a thickness of about 100 to 150 Angstroms is deposited on the bottom shield 10 and along the sidewalls 21 of the MTJ element by a chemical vapor deposition (CVD) or physical vapor deposition (PVD) method. Optionally, a seed layer (not shown) such as TiW, Cr, CrTi, or CrMo may be formed on the first dielectric layer. Next, a hard bias layer 23 that may be comprised of CoCrPt or FePt is deposited on the first dielectric layer 22 (or seed layer) by an ion beam deposition (IBD) or PVD process. In an alternative embodiment, a soft magnetic underlayer such as NiFe, CoFe, CoNiFe, FeTaN, or FeAlN is formed on a seed layer to promote good lattice matching between the seed layer and hard bias layer 23. Then a second dielectric layer 24 is deposited on the first dielectric layer 22 and on the hard bias layer 23 with a CVD or PVD method, for example. In one embodiment, the hard bias layer 23 has a thickness of about 200 to 400 Angstroms and the second dielectric layer 24 has a thickness between about 150 and 250 Angstroms. A planarization step such as a chemical mechanical polish (CMP) process may be employed to make the second dielectric layer 24 coplanar with the top surface 20a of the capping layer 20. An upper shield 25 is disposed on the top surface 20a of the capping layer 20 and on the second dielectric layer 24. The upper shield 25 may be a composite layer such as Ta/NiFe as appreciated by those skilled in the art.

Figure 6:
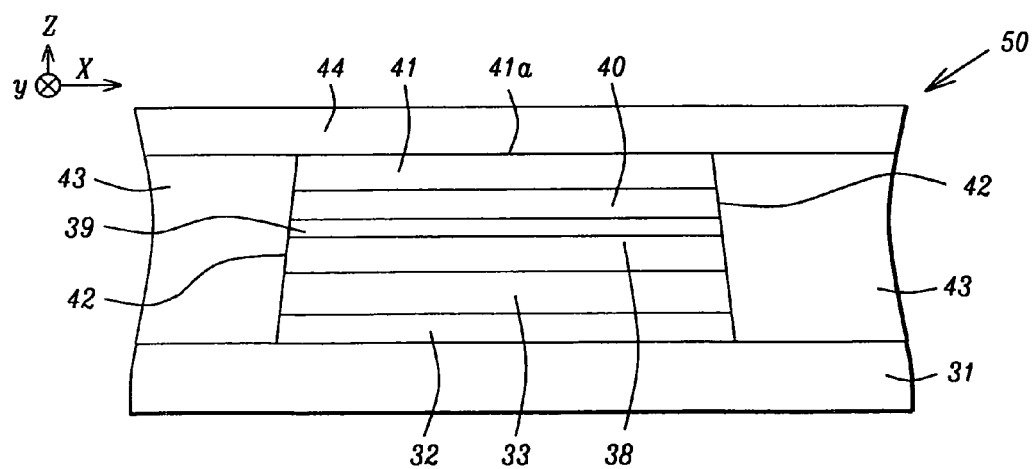
FIG. 6 is a cross-sectional view of a read head comprised of a TMR sensor according to the third embodiment of the present invention.

Referring to FIG. 6, a TMR head 50 having a MTJ element comprised of layers 32-41 and with sidewalls 42 and a top surface 41a may be fabricated by coating and patterning a photoresist layer (not shown) on the capping layer surface 41a after all of the layers in the MTJ stack are deposited. The photoresist layer serves as an etch mask during an ion beam etch (IBE) or reactive ion etch (RIE) sequence that transfers the pattern through the MTJ stack of layers to form the sidewalls 42 that are typically sloped so that the top surface 41a has a smaller width along the x-axis than that of the seed layer 32. Once the etch sequence is complete, the photoresist layer may be removed by a conventional stripping process known to those skilled in the art. Then an insulation layer 43 is formed on the bottom shield 31 and adjacent to the sidewalls 42 by a conventional method that may involve depositing an insulation material with a low dielectric constant and then planarizing the insulation layer 43 to be coplanar with the top surface 41a of the MTJ element.

The advantages of the GMR-CPP embodiments are the same as for the TMR embodiments in that the insertion layer comprised of an amorphous magnetic layer or non-magnetic layer improves the exchange properties of the AFM layer and AP2 pinned layer in a MTJ element. As a result, a larger Hex/Hc ratio is achieved and thereby the amount of so-called "popcorn noise" in the device is reduced. In other words, as Hex/Hc increases, the popcorn noise decreases thereby improving device performance. Furthermore, less pin dispersion is observed in the MTJ element according to the present invention compared to the prior art. A reduction in pin dispersion is well known to produce a more stable device.

Comparative Example 1

An experiment was conducted to demonstrate the improved performance of a MTJ stack of layers comprised of a seed layer, IrMn AFM layer, insertion layer, AP2 pinned layer and capping layer that were sequentially formed on a substrate made of AlTiC. Note that the coupling layer, AP1 layer, spacer or tunnel barrier, and free layer in a typical MTJ stack are not necessary to demonstrate the effect on Hex and Hc in this experiment. However, those skilled in the art will appreciate that the benefits observed for the insertion layer in the abbreviated MTJ stack described herein will fully translate to a full MTJ stack in a GMR or TMR spin valve structure. In this example, the seed layer has a 20 Angstrom thick lower Ta layer and a 20 Angstrom thick Ru upper layer, the IrMn AFM layer has a thickness of 70 Angstroms, the AP2 layer is CoFe with a Fe content of 25 atomic % and a 24 Angstrom thickness, and the capping layer has a 10 Angstrom thick Ru lower layer and a 50 Angstrom thick Ta upper layer. This example represents a GMR-CPP or TMR embodiment wherein an insertion layer is formed between the AFM layer and AP2 layer. In this case, the insertion layer is $Co_xFe_yB_z$ where x=60 atomic %, y=20 atomic %, and z=20 atomic %. The results are compared with those from a conventional structure that has no insertion layer and is labeled as the reference.

TABLE 1

Exchange properties for IrMn/AP2 structures with or without CoFeB insertion

| Seed/AFM/IL/AP2 configuration | Insertion layer (IL) | Hex (Oe) | Hc (Oe) | Hex/Hc |
|---|---|---|---|---|
| Ta20/Ru20/IrMn70/IL/CoFe(25%)24 | none (reference) | 1732 | 224 | 7.7 |
| Ta20/Ru20/IrMn70/IL/CoFe(25%)24 | 1 Ang. CoFeB | 2039 | 152 | 13.4 |
| Ta20/Ru20/IrMn70/IL/CoFe(25%)24 | 2 Ang. CoFeB | 1877 | 96 | 19.6 |
| Ta20/Ru20/IrMn70/IL/CoFe(25%)24 | 3 Ang. CoFeB | 1734 | 78 | 22.2 |
| Ta20/Ru20/IrMn70/IL/CoFe(25%)24 | 4 Ang. CoFeB | 1594 | 42 | 38.0 |
| Ta20/Ru20/IrMn70/IL/CoFe(25%)24 | 5 Ang. CoFeB | 1317 | 47 | 28.0 |

The results in rows 2-6 where the CoFeB insertion layer thickness varies between 1 and 5 Angstroms clearly indicate that the exchange bias properties such as Hex and Hex/Hc are significantly improved compared with the reference in row 1 where no insertion layer is used between the IrMn AFM layer and the CoFe AP2 layer. Even with a 3 Angstrom thick CoFeB insertion layer, the AP2 moment is increased as indicated by a slightly larger Hex of 1734 Oe vs. 1732 Oe for the reference. Furthermore, the Hex/Hc ratio for the configuration with a 3 Angstrom thick CoFeB insertion layer is nearly three times higher than that of the reference. It should also be noted that the improved pinning structure comprised of an insertion layer has been implemented in a TMR sensor and a GMR-CPP sensor without any reduction in the MR ratio. Overall, better head performance is realized because a higher Hex and larger Hex/Hc ratio can be achieved without comprising the MR ratio and signal amplitude.

While this invention has been particularly shown and described with reference to, the preferred embodiment thereof, it will be understood by those skilled in the art that various changes in form and details may be made without departing from the spirit and scope of this invention.

We claim:

1. An exchange coupling film for improving exchange properties between an anti-ferromagnetic (AFM) layer and a SyAP pinned layer having a AP2/coupling layer/AP1 configuration in a magnetoresistive element, consisting of:
    a single amorphous magnetic layer formed in the SyAP pinned layer and
    comprised of at least one element of Co, Fe, or Ni, and at least one element selected from Hf, Ta, or Ti, or a non-magnetic layer comprised of Cu, Ru, Mn, Hf, Nb, or Zr, said exchange coupling film is formed within said AP2 portion of the SyAP pinned layer in the magnetoresistive element and said AP2 pinned layer is formed on said AFM layer.

2. The exchange coupling film of claim 1 wherein the magnetoresistive element is a GMR or TMR sensor in a recording head.

3. The exchange coupling film of claim 1 wherein the amorphous magnetic layer has a thickness between about 1 and 15 Angstroms.

4. The exchange coupling film of claim 1 wherein the non-magnetic layer has a thickness between about 1 and 5 Angstroms.

5. The exchange coupling film of claim 1 wherein the AFM layer is comprised of IrMn and the AP2 portion of the pinned layer is comprised of CoFe.

6. The exchange coupling film of claim 1 wherein the amorphous magnetic layer has a $CoFe_{(100-X)}A_X$ or $CoFeNi_{(100-X)}A_X$ composition where A is an element selected from Hf, Ta, or Ti, and x<40 atomic %, or has a $CoFe_{(100-X-Y)}A_XM_Y$ or $CoFeNi_{(100-X-Y)}A_XM_Y$ composition wherein A and M are elements selected from Hf, Ta, or Ti, and x+y<40 atomic %.

7. A magnetoresistive element, comprising:
(a) a seed layer;
(b) an AFM layer;
(c) a pinned layer having a SyAP configuration represented by AP2 layer/coupling layer/AP1 layer wherein said AP1 layer consists of CoFe, CoFeB/CoFe, or a $(CoFe/Cu)_n$/CoFe configuration where n is 2 or 3, and contacts a spacer layer or tunnel barrier layer;
(d) at least one exchange coupling film formed within the AP2 layer and comprising an amorphous magnetic layer comprised of at least one element of Co, Fe, or Ni, and at least one element selected from Hf, Ta, or Ti, or a non-magnetic layer comprised of Cu, Ru, Mn, Hf, Nb, or Zr;
(e) a spacer layer or tunnel barrier layer;
(f) a free layer; and
(g) a capping layer.

8. The magnetoresistive element of claim 7 further comprised of a second exchange coupling film formed between the AFM layer and AP2 layer.

9. A method of forming a magnetoresistive element, comprising:
(a) forming a seed layer on a substrate;
(b) forming an AFM layer on the seed layer; and
(c) forming a pinned layer on said AFM layer, said pinned layer has an AP2/coupling layer/AP1 configuration wherein the AP1 layer consists of CoFe, CoFeB/CoFe, or a $(CoFe/Cu)_n$/CoFe configuration where n is 2 or 3 and the AP2 layer is a composite comprising:
(1) a lower portion of the AP2 layer that contacts said AFM layer;
(2) an insertion layer formed on the lower portion of the AP2 layer, said insertion layer is an amorphous magnetic layer comprised of at least one element of Co, Fe, or Ni, and at least one element selected from Hf, Ta, or Ti, or a non-magnetic layer comprised of Cu, Ru, Mn, Hf, Nb, or Zr; and
(3) forming an upper portion of the AP2 layer on the insertion layer.

10. The method of claim 9 wherein the amorphous magnetic layer has a thickness between about 1 and 15 Angstroms or the non-magnetic layer has a thickness from about 1 to 5 Angstroms.

11. The method of claim 9 wherein the AFM layer is comprised of IrMn, the AP2 layer is made of CoFe, and the insertion layer has a $CoFe_{(100-X)}A_X$ or $CoFeNi_{(100-X)}A_X$ composition where A is an element selected from Hf, Ta, or Ti, and x<40 atomic %, or has a $CoFe_{(100-X-Y)}A_XM_Y$ or $CoFeNi_{(100-X)}A_XM_Y$ composition wherein A and M are elements selected from Hf, Ta, or Ti, and x+y<40 atomic %.

* * * * *